(12) United States Patent
Sausen et al.

(10) Patent No.: US 11,808,392 B2
(45) Date of Patent: Nov. 7, 2023

(54) CONNECTION VERIFIER

(71) Applicant: Oetiker NY, Inc., Lancaster, NY (US)

(72) Inventors: Kari Ann Sausen, Clarence, NY (US);
Kristian James Hagen, Gasport, NY (US); James E. Caroll, Aurora, OH (US)

(73) Assignee: Oetiker NY, Inc., Lancaster, NY (US)

( * ) Notice: Subject to any disclaimer, the term of this patent is extended or adjusted under 35 U.S.C. 154(b) by 286 days.

(21) Appl. No.: 17/593,409

(22) PCT Filed: May 14, 2019

(86) PCT No.: PCT/US2019/032190
§ 371 (c)(1),
(2) Date: Sep. 17, 2021

(87) PCT Pub. No.: WO2020/231409
PCT Pub. Date: Nov. 19, 2020

(65) Prior Publication Data
US 2022/0186867 A1    Jun. 16, 2022

(51) Int. Cl.
*F16L 37/088*   (2006.01)
*H05K 5/02*   (2006.01)

(52) U.S. Cl.
CPC .......... *F16L 37/088* (2013.01); *H05K 5/0247* (2013.01); *F16L 2201/10* (2013.01)

(58) Field of Classification Search
CPC . F16L 37/088; F16L 37/0885; F16L 37/0985; F16L 2201/10

USPC .......................................................... 285/93
See application file for complete search history.

(56) References Cited

U.S. PATENT DOCUMENTS

| | | | |
|---|---|---|---|
| 6,649,829 B2 | 11/2003 | Garber et al. | |
| 7,244,142 B2 | 7/2007 | Kato | |
| 7,246,980 B2 | 7/2007 | Azzalin et al. | |
| 7,394,375 B2 | 7/2008 | Johnson | |
| 8,439,404 B2 | 5/2013 | Anton et al. | |
| 9,010,810 B2 | 4/2015 | Anton et al. | |
| 9,224,017 B2 | 12/2015 | Johnson et al. | |
| 9,400,070 B2 | 7/2016 | Anton et al. | |
| 2002/0170731 A1 | 11/2002 | Garber et al. | |
| 2005/0063125 A1 | 3/2005 | Kato | |
| 2012/0211974 A1 | 8/2012 | Richardson | |
| 2017/0114935 A1 | 4/2017 | Kujawski, Jr. et al. | |
| 2018/0073670 A1 | 3/2018 | Wolfgang | |
| 2018/0119858 A1 | 5/2018 | Rojas Lopez et al. | |
| 2018/0266602 A1* | 9/2018 | Fremont | F16L 37/0985 |
| 2019/0049049 A1 | 2/2019 | Ignaczak et al. | |

FOREIGN PATENT DOCUMENTS

| | | |
|---|---|---|
| DE | 102004006795 | 9/2005 |
| DE | 102005029061 | 1/2007 |
| DE | 102009043088 | 3/2011 |
| JP | H0828773 | 2/1996 |

(Continued)

*Primary Examiner* — Aaron M Dunwoody
(74) *Attorney, Agent, or Firm* — Harter Secrest & Emery LLP; Michael Nicholas Vranjes

(57) ABSTRACT

A connection verifier, including a housing including a circuit board, a first plate connected to the circuit board, and a second plate connected to the circuit board, wherein the circuit board is arranged to send a voltage through one of the first plate and the second plate.

12 Claims, 9 Drawing Sheets

(56) References Cited

FOREIGN PATENT DOCUMENTS

| | | |
|---|---|---|
| JP | 2003006599 | 1/2003 |
| JP | 2005069445 | 3/2005 |
| JP | 2013127311 | 6/2013 |
| WO | WO2007003770 | 1/2007 |

* cited by examiner

CONNECTION VERIFIER

CROSS-REFERENCE TO RELATED APPLICATIONS

The present application is the United States National Stage Application pursuant to 35 U.S.C. § 371 of International Patent Application No. PCT/US2019/032190, filed on May 14, 2019, which application is incorporated herein by reference in its entirety.

FIELD

The present disclosure relates to a connection verifier for a fluid connection, and, more particularly, to a connection verifier that indicates the status of a connection both on site and at a remote location, via wireless transmission.

BACKGROUND

Fluid connectors are integral components for many applications, and especially for automotive applications. Since an automotive system is made up of various components such as a radiator, transmission, and engine, fluid must be able to travel not only within each component but also between components. An example of fluid traveling between components is the transmission fluid traveling from the transmission to the transmission oil cooler in order to lower the temperature of the transmission fluid. Fluid predominantly moves between components via flexible or rigid hoses which connect to each component by fluid connectors. Such fluid connectors typically include a retaining clip or snap ring carried on the fluid connector which is adapted to snap behind a raised shoulder of a tube end form when the tube end form is fully inserted into the fluid connector. If the tube end form is not fully inserted into the fluid connector, the fluid connection may fail causing fluids to leak out and other more serious consequences.

Thus, there has been a long-felt need for a connection verifier to ensure that a fluid connection is securely connected.

SUMMARY

According to aspects illustrated herein, there is provided a connection verifier, comprising a housing including a circuit board, a first plate connected to the circuit board, and a second plate connected to the circuit board, wherein the circuit board is arranged to send a voltage through one of the first plate and the second plate.

According to aspects illustrated herein, there is provided a connection verifying connector assembly, comprising a connector assembly, including a first through-bore, a first annular groove, a second annular groove, and a retainer clip arranged in the first annular groove, the retainer clip having one or more protrusions that extend into the first through-bore, and a connection verifier connected to the connector assembly, including a housing including a circuit board, a first plate connected to the circuit board and arranged radially outward of the retainer clip, and a second plate connected to the circuit board and arranged radially outward of the retainer clip, wherein the circuit board is arranged to send a voltage through one of the first plate and the second plate.

These and other objects, features, and advantages of the present disclosure will become readily apparent upon a review of the following detailed description of the disclosure, in view of the drawings and appended claims.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

At the outset, it should be appreciated that like drawing numbers on different drawing views identify identical, or functionally similar, structural elements. It is to be understood that the claims are not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the claims.

Unless defined otherwise, all technical and scientific terms used herein have the same meaning as commonly understood to one of ordinary skill in the art to which this disclosure pertains. It should be understood that any methods, devices or materials similar or equivalent to those described herein can be used in the practice or testing of the example embodiments. The assembly of the present disclosure could be driven by hydraulics, electronics, and/or pneumatics.

It should be appreciated that the term "substantially" is synonymous with terms such as "nearly," "very nearly," "about," "approximately," "around," "bordering on," "close to," "essentially," "in the neighborhood of," "in the vicinity of," etc., and such terms may be used interchangeably as appearing in the specification and claims. It should be appreciated that the term "proximate" is synonymous with terms such as "nearby," "close," "adjacent," "neighboring," "immediate," "adjoining," etc., and such terms may be used interchangeably as appearing in the specification and claims. The term "approximately" is intended to mean values within ten percent of the specified value.

Figure 1A:
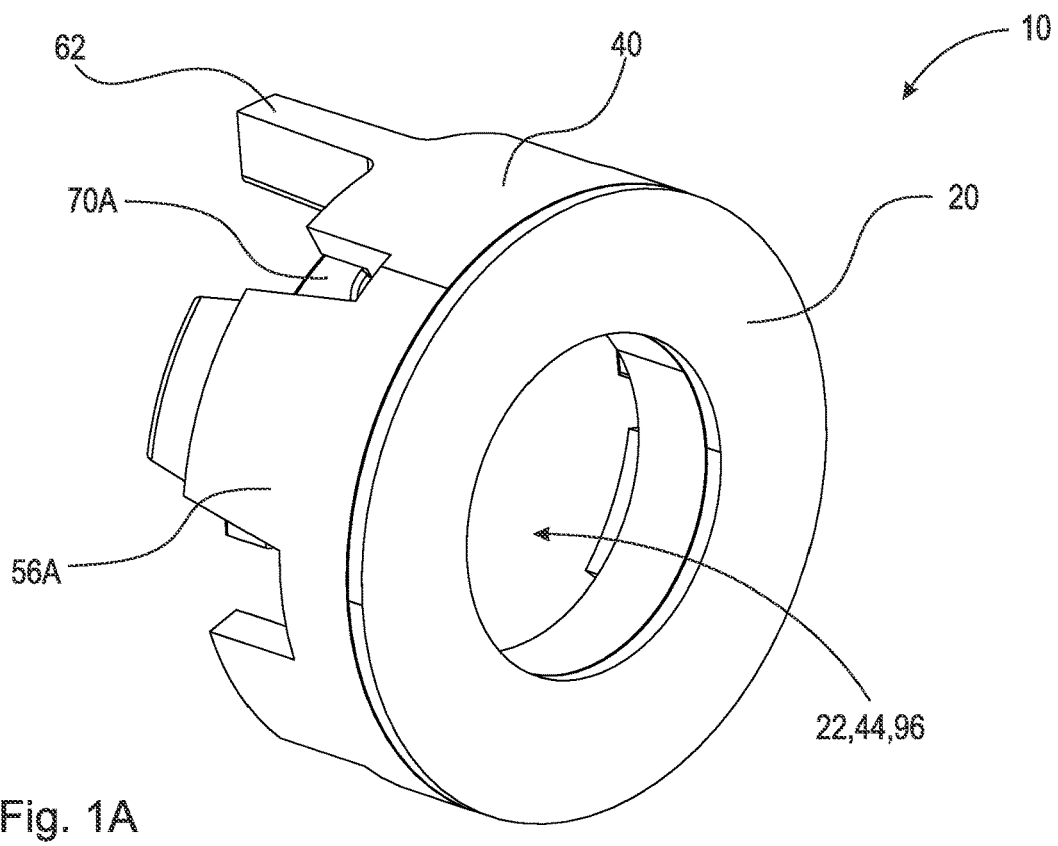
FIG. 1A is a front perspective view of a connection verifier.
Figure 1B:
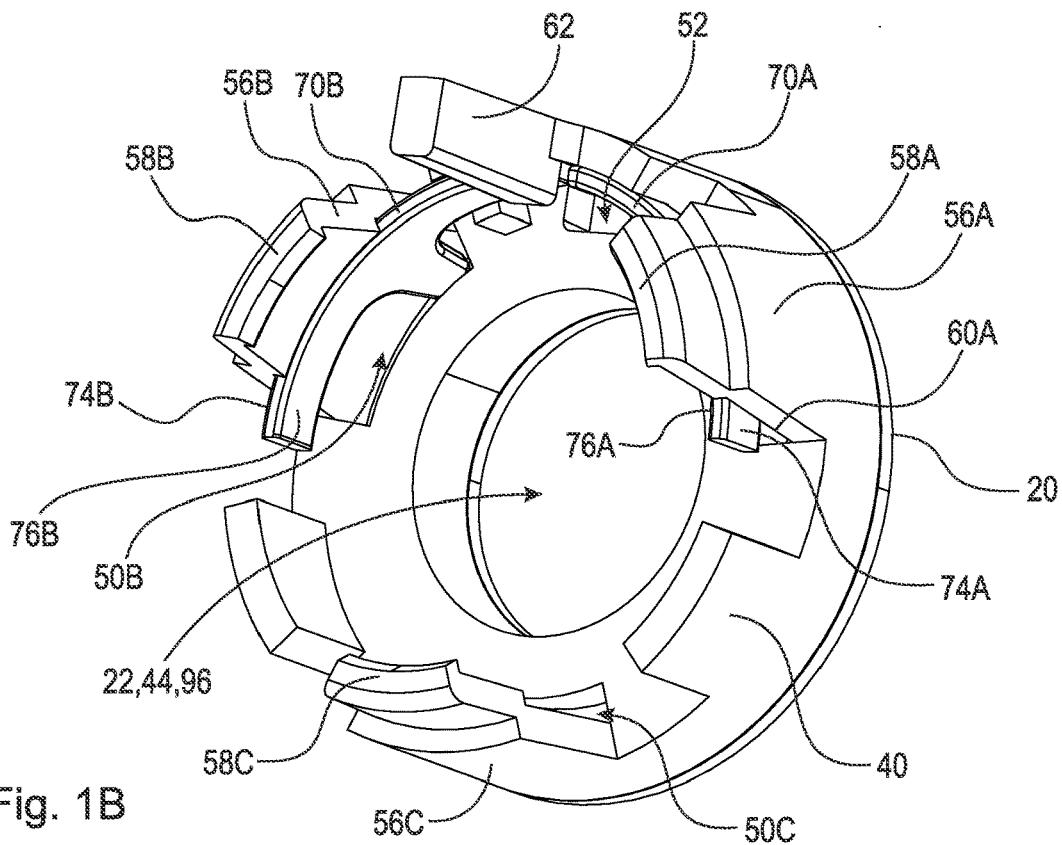
FIG. 1B is a rear perspective view of the connection verifier shown in FIG. 1.
Figure 2A:
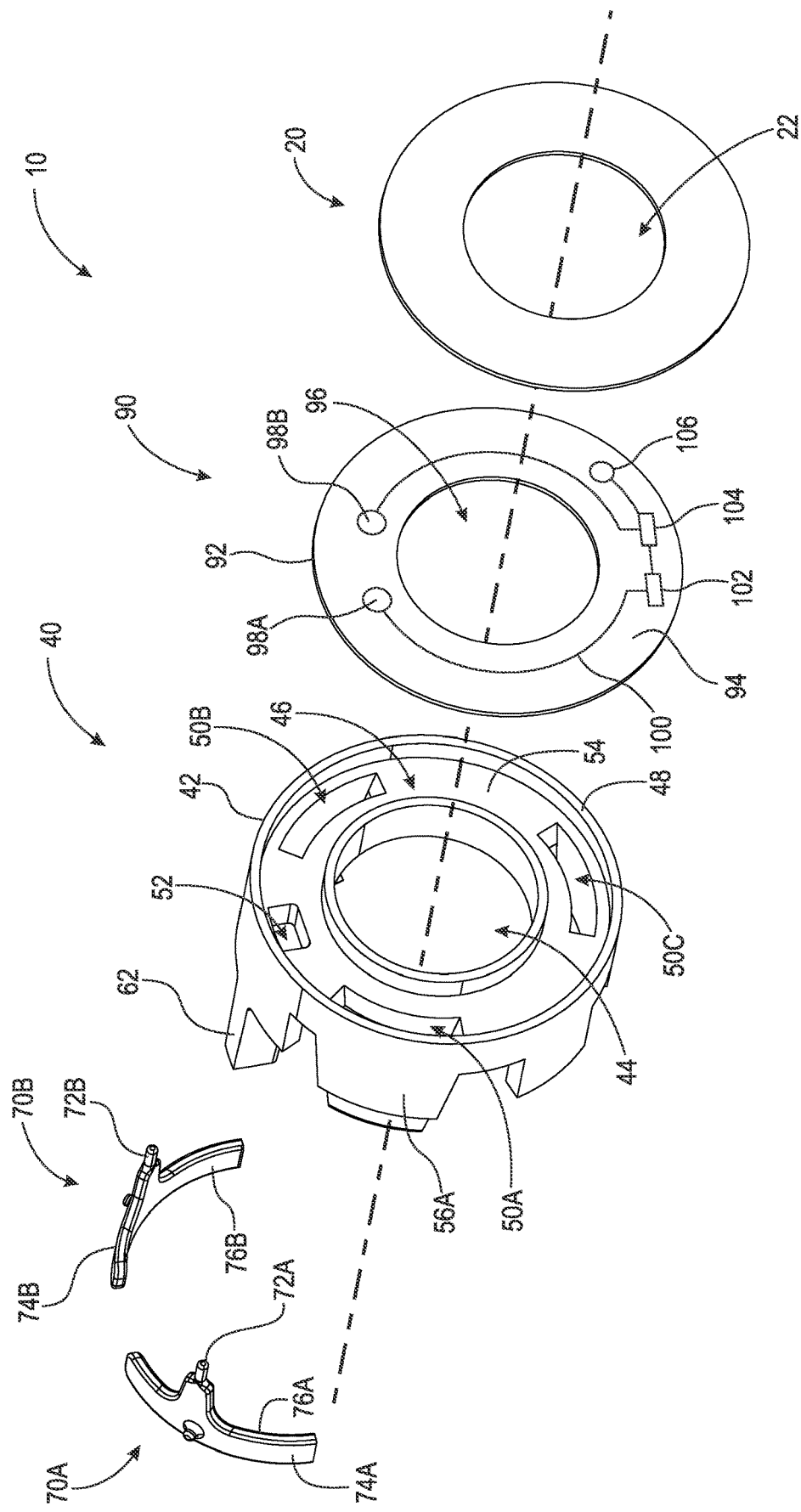
FIG. 2A is a front exploded perspective view of the connection verifier shown in FIG. 1.
Figure 2B:
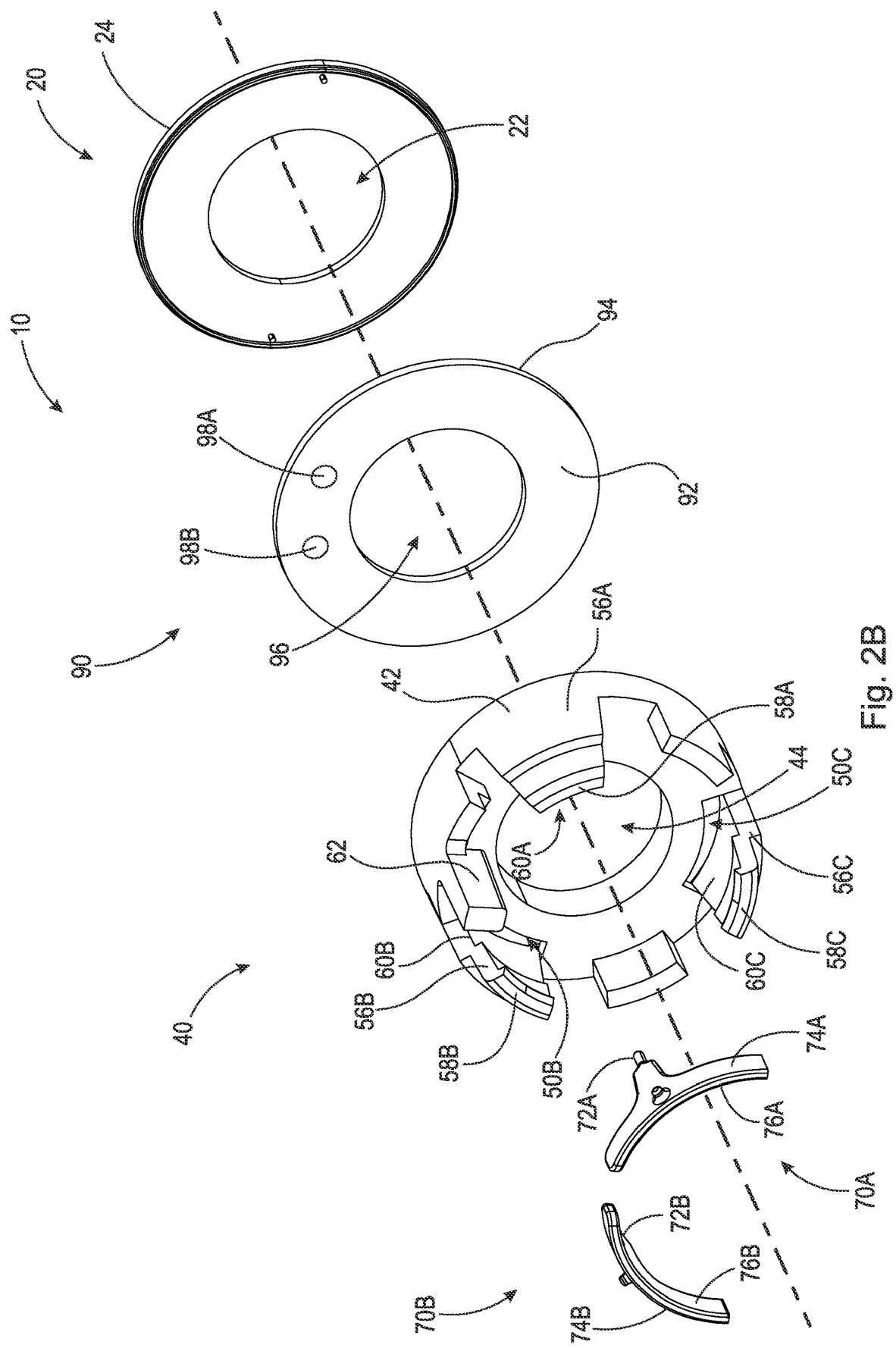
FIG. 2B is a rear exploded perspective view of the connection verifier shown in FIG. 1.

Adverting now to the figures, FIG. 1A is a front perspective view of connection verifier 10. FIG. 1B is a rear perspective view of connection verifier 10. FIG. 2A is a front exploded perspective view of connection verifier 10. FIG. 2B is a rear exploded perspective view of connection verifier 10. Connection verifier 10 generally comprises cover plate 20, housing 40, plates 70A and 70B, and circuit board 90. The following description should be read in view of FIGS. 1A-2B.

Figure 3:
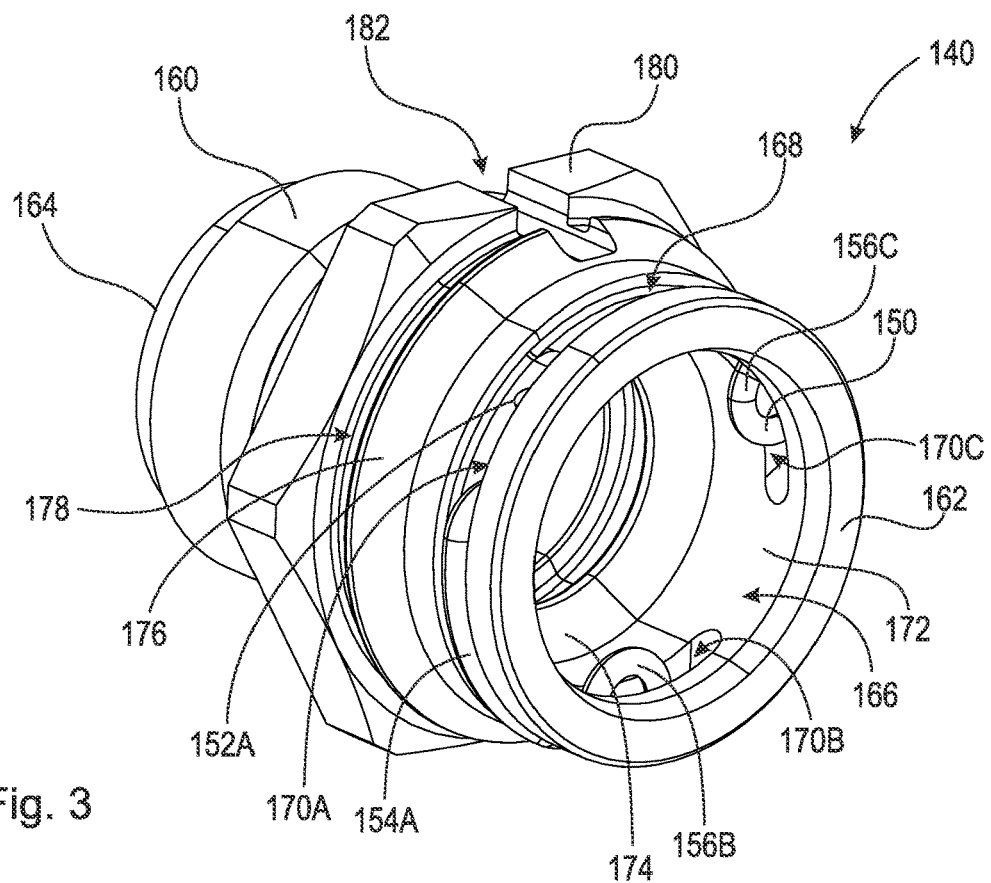
FIG. 3 is a front perspective view of a quick connector assembly.

Cover plate 20 is generally disc-shaped comprising through-bore 22. Cover plate 20 is operatively arranged to engage housing 40 to secure circuit board 90 therein. In some embodiments, cover plate 20 is a plate that abuts against and is connected to surface 48 of housing 40. Cover plate 20 may be connected to housing 40 via any suitable means, for example, welding, soldering, adhesives, bolts, screws, rivets, etc. In some embodiments, cover plate 20 comprises flange 24 arranged proximate its radially outermost edge. Flange 24 is arranged to engage surface 48 such that cover plate 20 may be secured to housing 40 via a press fit. In some embodiments, cover plate 20 is fixedly secured to housing 40. In some embodiments, cover plate 20 is removably secured to housing 40. Through-bore 22 comprises a diameter that is large enough such that a tube endform may fit therethrough. In some embodiments, through-bore 22 is greater than or equal to through-bore 166 of connector assembly 160 (connector assembly 160 is shown in FIG. 3). In some embodiments, through-bore 22 is equal to through-bore 44 of housing 40. In some embodiments, cover plate 20 comprises a polymer, ceramic, or other non-conductive material. In some embodiments, cover plate 20 comprises a conductive material.

Housing 40 comprises body 42 and a plurality of arms, for example, arms 56A-C. Housing 40 may further comprise protrusion 62. Body 42 is generally cylindrical in shape and comprises through-bore 44, one or more apertures, for example, apertures 50A-C and 52, and recess 46. Recess 46 extends axially from surface 48 to surface 54, and is operatively arranged to house circuit board 90.

Arm 56A extends axially from body 42. Arm 56A comprises radially inward extending tab 58A and radially inward facing surface 60A. Radially inward facing surface 60A of arm 56A may include a plurality of stepped surfaces. Radially inward facing surface 60A is operatively arranged to engage a plate, for example, plate 70A, as will be discussed in greater detail below. Arm 56A is operatively arranged to engage groove 178 of connector 160 to secure connection verifier 10 to quick connector assembly 140, as will be discussed in greater detail below.

Arm 56B extends axially from body 42. Arm 56B comprises radially inward extending tab 58B and radially inward facing surface 60B. Radially inward facing surface 60B of arm 56B may include a plurality of stepped surfaces. Radially inward facing surface 60B is operatively arranged to engage a plate, for example, plate 70B, as will be discussed in greater detail below. Arm 56B is operatively arranged to engage groove 178 of connector 160 to secure connection verifier 10 to quick connector assembly 140, as will be discussed in greater detail below.

Arm 56C extends axially from body 42. Arm 56C comprises radially inward extending tab 58C and radially inward facing surface 60C. Radially inward facing surface 60C of arm 56C may include a plurality of stepped surfaces. In some embodiments, radially inward facing surface 60C is operatively arranged to engage a plate, for example plate 70A, 70B, or a third plate, as will be discussed in greater detail below. Arm 56C is operatively arranged to engage groove 178 of connector 160 to secure connection verifier 10 to quick connector assembly 140, as will be discussed in greater detail below.

In some embodiments, arms 56A-C are circumferentially arranged at sixty degrees apart about a center point of through-bore 44. In some embodiments, arms 56A-C are circumferentially spaced at any arrangement such that they allow for suitable connection of housing 40 to connector 160. In some embodiments, housing 40 comprises two arms.

Protrusion 62 extends axially from body 42. Protrusion 62 is operatively arranged to engage a slot arranged on connector 160 to properly align connection verifier 10 with quick connector assembly 140 when fully assembled. Specifically, protrusion 62 engages slot 182 on connector 160 to properly circumferentially align housing 40 with quick connector assembly 140, such that plates 70A and 70B are circumferentially aligned with sections 154A and 154B, respectively, of retainer clip 150, as will be discussed in greater detail below. In some embodiments, protrusion 62 is a rectangular prism; however, it should be appreciated that protrusion 62 may comprise any suitable geometry suitable for engaging connector 160 such that connection verifier 10 is properly aligned with quick connector assembly 140, for example, square, triangular, ovular, trapezoidal, circular, etc. In some embodiments, housing 40 comprises a polymer, ceramic, or other non-conductive material. In some embodiments, housing 40 comprises a conductive material.

Plate 70A is generally a curvilinear plate comprising pin 72A, radially outward facing surface 74A, and radially inward facing surface 76A. Plate 70A comprises a material that is electrically conductive, for example, copper. When connection verifier 10 is fully assembled, radially outward facing surface 74A abuts against or is arranged substantially proximate to radially inward facing surface 60A of arm 56A. Pin 72A extends through aperture 50A and is connected to circuit board 90, for example, at terminal 98A. Radially inward facing surface 76A is operatively arranged to engage retainer clip 150, specifically, section 154A and/or end 152A, when retainer clip 150 is sufficiently expanded due to insertion of tube endform 120, as will be discussed in greater detail below. Radially outward facing surface 74A may further comprise a positioning protrusion that is operatively arranged to engage a positioning indentation arranged on radially inward facing surface 60A.

Plate 70B is generally a curvilinear plate comprising pin 72B, radially outward facing surface 74B, and radially inward facing surface 76B. Plate 70B comprises a material that is electrically conductive, for example, copper. When connection verifier 10 is fully assembled, radially outward facing surface 74B abuts against or is arranged substantially proximate to radially inward facing surface 60B of arm 56B. Pin 72B extends through aperture 50B and is connected to circuit board 90, for example, at terminal 98B. Radially inward facing surface 76B is operatively arranged to engage retainer clip 150, specifically, section 154B and/or end 152B, when retainer clip 150 is sufficiently expanded due to insertion of tube endform 120, as will be discussed in greater detail below. Radially outward facing surface 74B may further comprise a positioning protrusion that is operatively arranged to engage a positioning indentation arranged on radially inward facing surface 60B. In some embodiments, plates 70A-B are circumferentially arranged at sixty degrees apart about a center point of through-bore 44, for example, to at least partially align with arms 56A-B. In some embodiments, plates 70A-B are circumferentially spaced at any arrangement such that they allow for suitable engagement with retainer clip 150. In some embodiments, connection verifier 10 comprises three plates that correspond with three arms 56A-C.

Circuit board 90 is generally disc-shaped and operatively arranged in recess 46 of housing 40. Circuit board 90 generally comprises surface 92, surface 94, and through-bore 96. Specifically, surface 92 is arranged to abut against or be in close proximity to surface 54. Circuit board 90 may comprise terminals 98A and 98B, which are arranged to electrically connect to pins 72A and 72B, respectively. As such, terminals 98A and 98B are at least partially axially aligned with apertures 50A and 50B, respectively. Circuit board 90 further may further comprise conductor 100, power source 102, and transponder 104. Conductor 100 electrically connects terminals 98A and 98B to power source 102 and/or transponder 104. Transponder 104 may further comprise radio-frequency identification (RFID) tag 106. Power source 102 sends a passive or active voltage to one of terminals 98A and 98B and thus plates 70A and 70B, respectively. When metallic retainer clip 150 expands to a suitable diameter, that is, to a diameter that indicates shoulder 132 of tube endform 120 has passed through retainer clip 150 to sufficiently connect tube endform 120 in quick connector assembly 140, it contacts both of plates 70A and 70B and completes the circuit therebetween. Transponder 104 detects that the circuit has been closed or completed and transmits or emits a signal representing such in response. Transponder 104 may store information of the completed circuit via RFID tag 106, such that a remote RFID reader can identify that a tube endform is fully connected to quick connector assembly 140. RFID tag 106 may be passive, active, or battery-assisted active. It should be appreciated that any sensor and/or transmitter combination suitable for detecting an open and closed circuit and transmitting or transferring such data may be used, and that this disclosure should not be limited to use of only a transponder and/or RFID tag.

In some embodiments, circuit board 90 may further comprise a microcontroller which contains one or more central processing units (CPUs) along with memory and programmable input output peripherals. The microcontroller may be used to: activate an indicator light (or other indicator device) upon verification of a secure connection, initiate, using a transmission device, the transmission of a signal to a receiver at a remote location indicating a secure connection (or an unsecure connection), and activate a tool failure indicator.

Connection verifier 10 further comprises a transmission device (i.e., transponder 104 or a device in addition to transponder 104) that is electrically connected to circuit board 90 and optionally a memory device or a microcontroller. The transmission device is arranged to transmit a signal to a remote location indicating that a fluid connection is secure, or unsecure. In some embodiments, the transmission device is arranged to send a signal via an electrical cable such as a wire or a fiber optic cable (i.e., a physical form of connection). The transmission device may use inter-integrated circuit ($I^2C$), controller area network (CAN), local interconnect network (LIN), or any suitable communication protocol known in the art. In some embodiments, the transmission device is arranged to send a wireless communication to a receiver at a remote location which records the data sent (i.e., whether the fluid connection is securely connected, or not). The transmission device may transmit the data using any suitable method known in the art, for example, Bluetooth® communication, radio frequency, infrared, and Wi-Fi® communication. In some embodiments, the transmission device may transmit the fluid connection identification number, the connection verifier identification number, the remaining life of the connection verifier, the vehicle identification number (VIN), the part number (e.g., engine, radiator, etc.) and serial number for that part, verification that a fluid connection is secure, and/or verification that a fluid connection is not secure. In some embodiments, connection verifier can operate in conjunction with another device, such as a computer, to allow an electronic record to be kept of each inspection, and print a pass/fail label.

Figure 4:
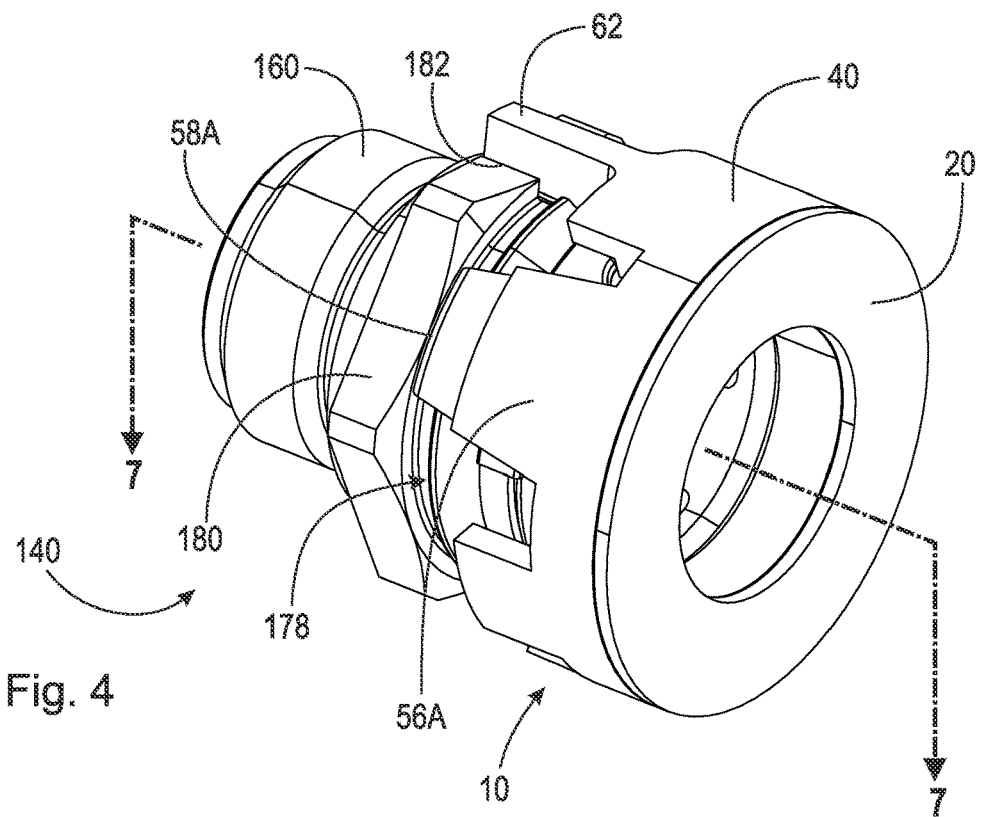
FIG. 4 is a front perspective view of the quick connector assembly shown in FIG. 3 with a connection verifier arranged thereon.
Figure 5:
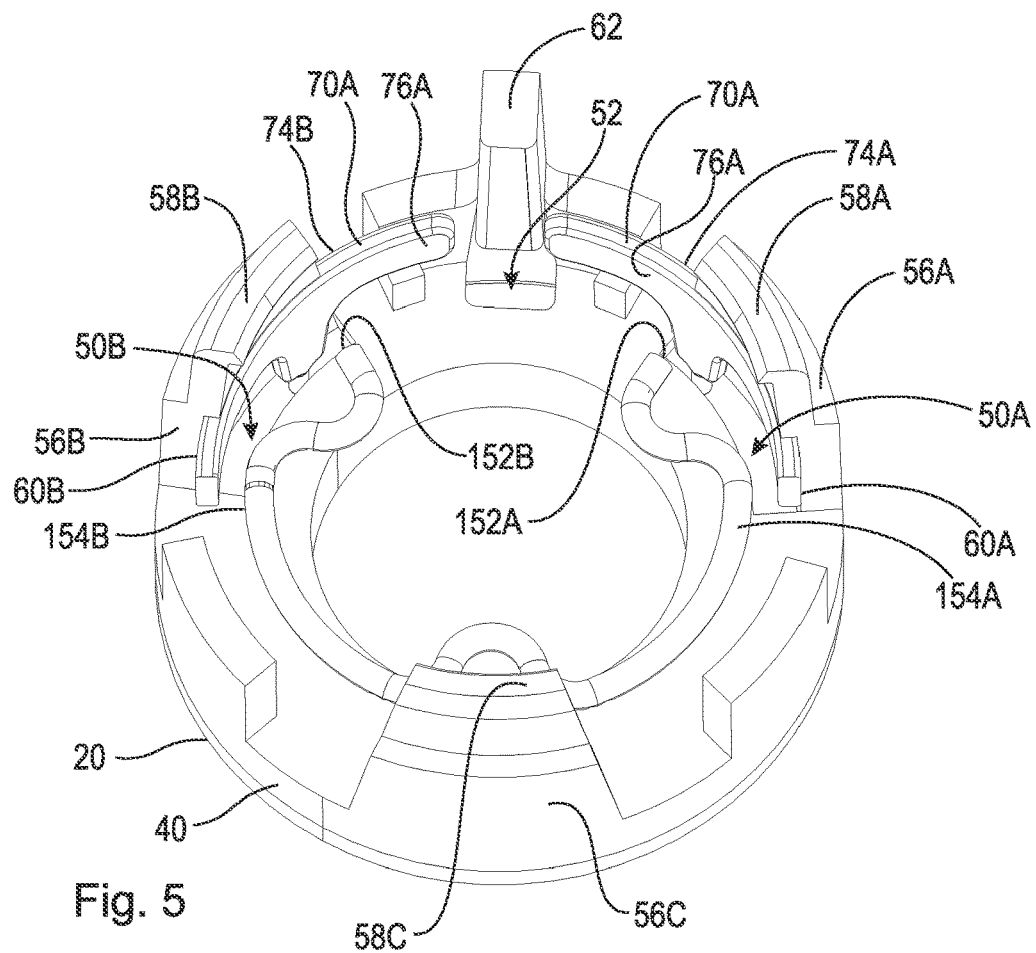
FIG. 5 is a rear perspective view of the quick connector assembly with the connection verifier arranged thereon, as shown in FIG. 4, with the connector hidden.
Figure 6:
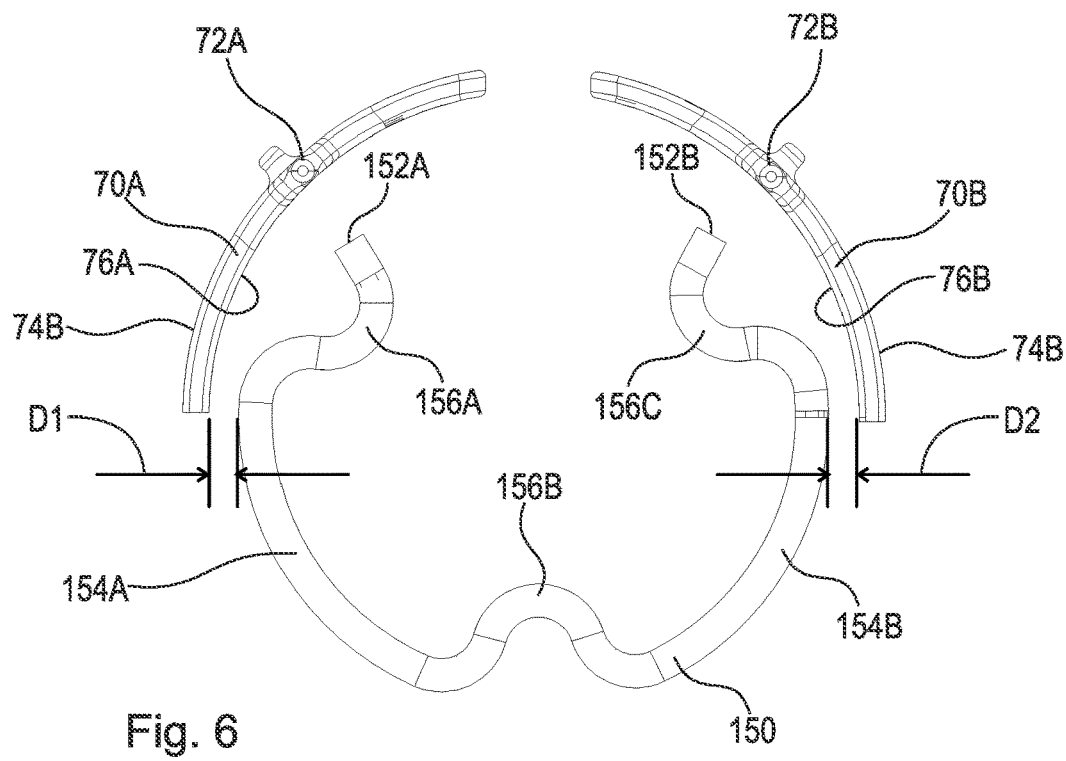
FIG. 6 is a front elevational view of the quick connector assembly with the connection verifier arranged thereon, as shown in FIG. 4, with the connector, housing, and cover plate hidden.

FIG. 3 is a front perspective view of quick connector assembly 140. FIG. 4 is a front perspective view of quick connector assembly 140 with connection verifier 10 arranged thereon. FIG. 5 is a rear perspective view of quick connector assembly 140 with connection verifier 10 arranged thereon, with connector 160 hidden. FIG. 6 is a front elevational view of quick connector assembly 140 with connection verifier 10 arranged thereon, with connector 160, housing 40, and cover plate 20 hidden. The following description should be read in view of FIGS. 3-6.

Quick connector assembly 140 generally comprises connector 160 and retainer clip 150. Quick connector assembly 140 is operatively arranged to engage and secure with tube endform 120 or similar tube in order to provide for a quick and sufficient fluid connection.

Connector 160 comprises end 162, end 164, through-bore 166, annular groove 168, radially inward facing surface 172, radially inward facing surface 174, radially outward facing surface 176, groove 178, and head 180. Annular groove 168 comprises one or more apertures, for example, apertures 170A-C. Radially inward facing surface 172 extends axially from end 162 and may be cylindrical or frusto-conical. Radially inward facing surface 174 extends axially from surface 172 and may be cylindrical or frusto-conical. Radially outward facing surface 176 is generally frusto-conical and extends radially outward in an axial direction from end 162 to end 164. Groove 178 is arranged adjacent to or proximate to radially outward facing surface 176. Specifically, as connection verifier 10 is assembled to quick connector assembly 140, tabs 58A-C engage frusto-conical surface 176 forcing arms 56A-C to displace radially outward until tabs 58A-C are axially aligned with groove 178, at which point arms 156A-C snap back (i.e., displace radially inward back to their original positions) such that tabs 58A-C are engaged with groove 178. Head 180 further comprises slot 182. Slot 182 is arranged to engage protrusion 62 to properly align connection verifier 10 with respect to quick connector assembly 140. Specifically, the engagement of protrusion 62 and slot 182 circumferentially aligns plate 70A with end 152A and section 154A, and plate 70B with end 152B and section 154B. This alignment ensures that as retainer clip 150 expands radially outward to a suitable diameter, it engages both plates 70A and 70B at the same time thereby completing the electrical connection with circuit board 90 (i.e. closing the circuit).

Retainer clip 150 comprises ends 152A-B, sections 154A-B, and protrusions 156A-C. Protrusions 156A-C extend radially inward from ends 152A-B and sections 154A-B. Ends 152A-B and/or sections 154A-B are operatively arranged to engage plates 70A-B, respectively. Protrusions 156A-C are operatively arranged to engage shoulder 132 of tube endform 120, such that as tube endform 120 is inserted into quick connector assembly 140, ends 152A-B and sections 154A-B expand radially outward to engage respective plates 70A-B. Retainer clip 150 is arranged in groove 168 with each of protrusions 156A-C protruding radially inward through apertures 170A-C to engage shoulder 132 of tube endform 120. In some embodiments, protrusions 156A-C protrude radially inward through apertures 170A-C, respectively.

As shown in FIGS. 5 and 6, in an unexpanded state, a space exists between retainer clip 150 and plates 70A-B. Specifically, radially inward facing surface 76A is spaced apart from section 154A by distance D1 and radially inward facing surface 76B is spaced apart from section 154B by distance D2. As retainer clip 150 expands radially outward, due to insertion of tube endform 120 and engagement of shoulder 132 with protrusions 156A-C, distances D1 and D2 decrease (i.e., sections 154A-B displace toward plates 70A-B, respectively, until contact occurs therebetween). In some embodiments, plates 70A-B are not circumferentially aligned with sections 154A-B, but are circumferentially aligned with ends 152A-B, respectively. In such case, ends 152A-B expand radially outward to contact radially inward facing surfaces 76A-B.

Figure 7A:
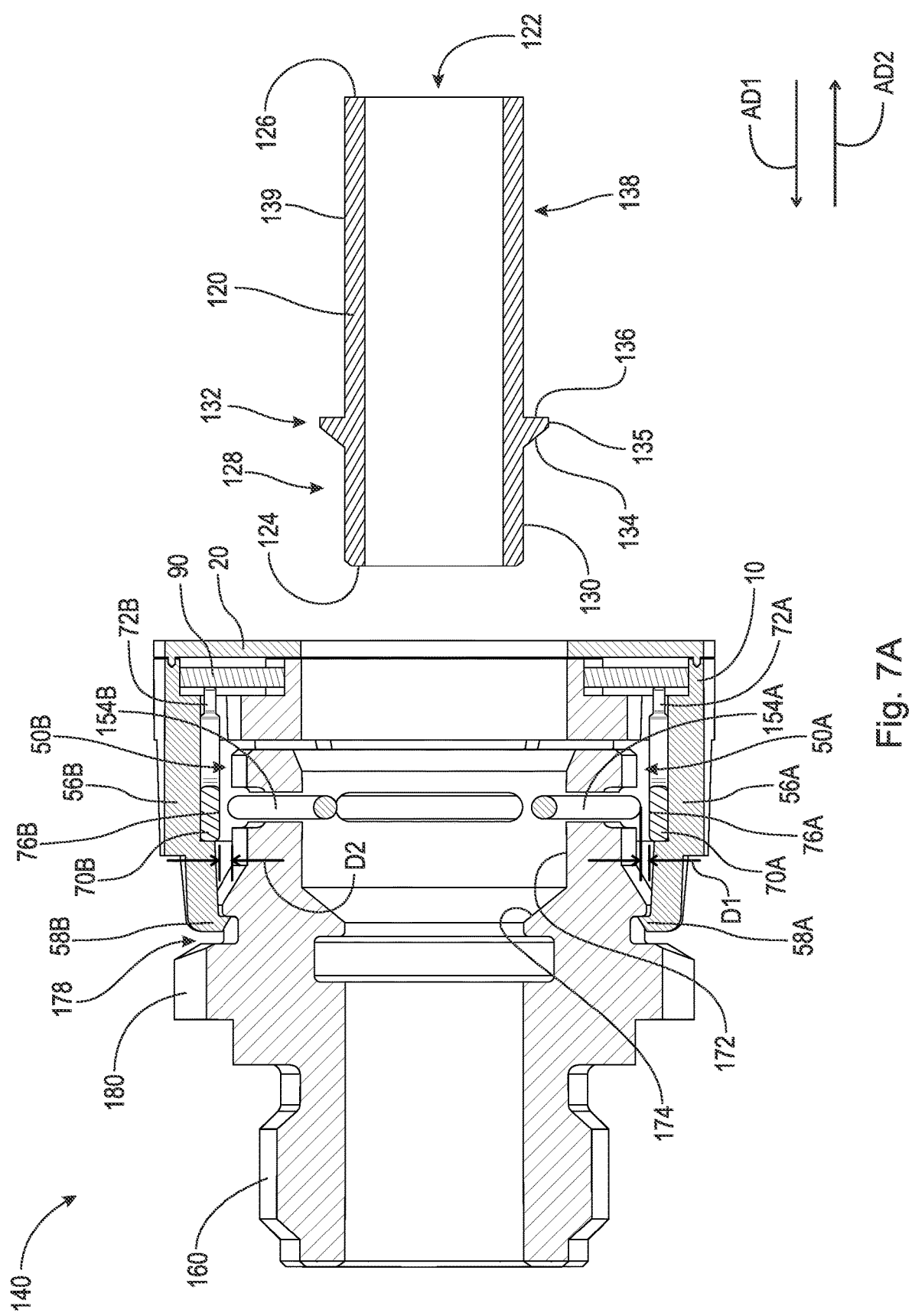
FIG. 7A is a cross-sectional view taken generally along line 7-7 in FIG. 4, prior to insertion of a tube endform.

FIG. 7A is a cross-sectional view taken generally along line 7-7 in FIG. 4, prior to insertion of tube endform 120. It should be noted that retainer clip 150 is in an unexpanded state. Specifically, section 154A is spaced apart from plate 70A by distance D1 and section 154A is spaced apart from plate 70A by distance D2.

Tube end form 120 comprises through-bore 122, end 124, end 126, section 128, shoulder 132, and section 138. Through-bore 122 extends through tube end form 120 from end 124 to end 126. Section 128 is arranged between end 124 and shoulder 132 and comprises radially outward facing surface 130. Radially outward facing surface 130 includes a substantially constant diameter. Shoulder 132 is arranged between section 128 and section 138 and comprises radially outward facing surface 134. Radially outward facing surface 134 is a linear conical shape and increases in diameter in axial direction AD1. Shoulder 132 may further comprise radially outward facing surface 135. Radially outward facing surface 135 includes a substantially constant diameter. Section 138 is arranged between shoulder 132 and end 126 and comprises radially outward facing surface 139. In the embodiment shown, radially outward facing surface 139 comprises a constant diameter extending from end 126 to shoulder surface 136. In some embodiments, radially outward facing surface 139 includes a variable diameter. Shoulder 132 is connected to radially outward facing surface 139 via shoulder surface 136. Tube end form 120 is arranged to be inserted, specifically with end 124 first, into quick connector assembly 140 in axial direction AD1. Tube end form 120 may utilize a linear ramp or a non-linear (i.e., curvilinear) ramp, and is inserted into quick connector assembly 140 until retainer clip 150 snaps over shoulder 132. It should be appreciated that tube end form 120 may be any traditional tube end form comprising a ramp, which extends radially outward and axially on the outer surface of the tube end form, to displace a retainer clip, snap ring, or wire clip within the fluid connector to secure the tube end form within the fluid connector. In order to determine that tube endform 120 and quick connector assembly 140 are securely connected, connection verifier 10 essentially verifies that retainer clip 150 has expanded radially outward a sufficient distance to have "snapped" over shoulder 132, as will be discussed in greater detail below.

Figure 7B:
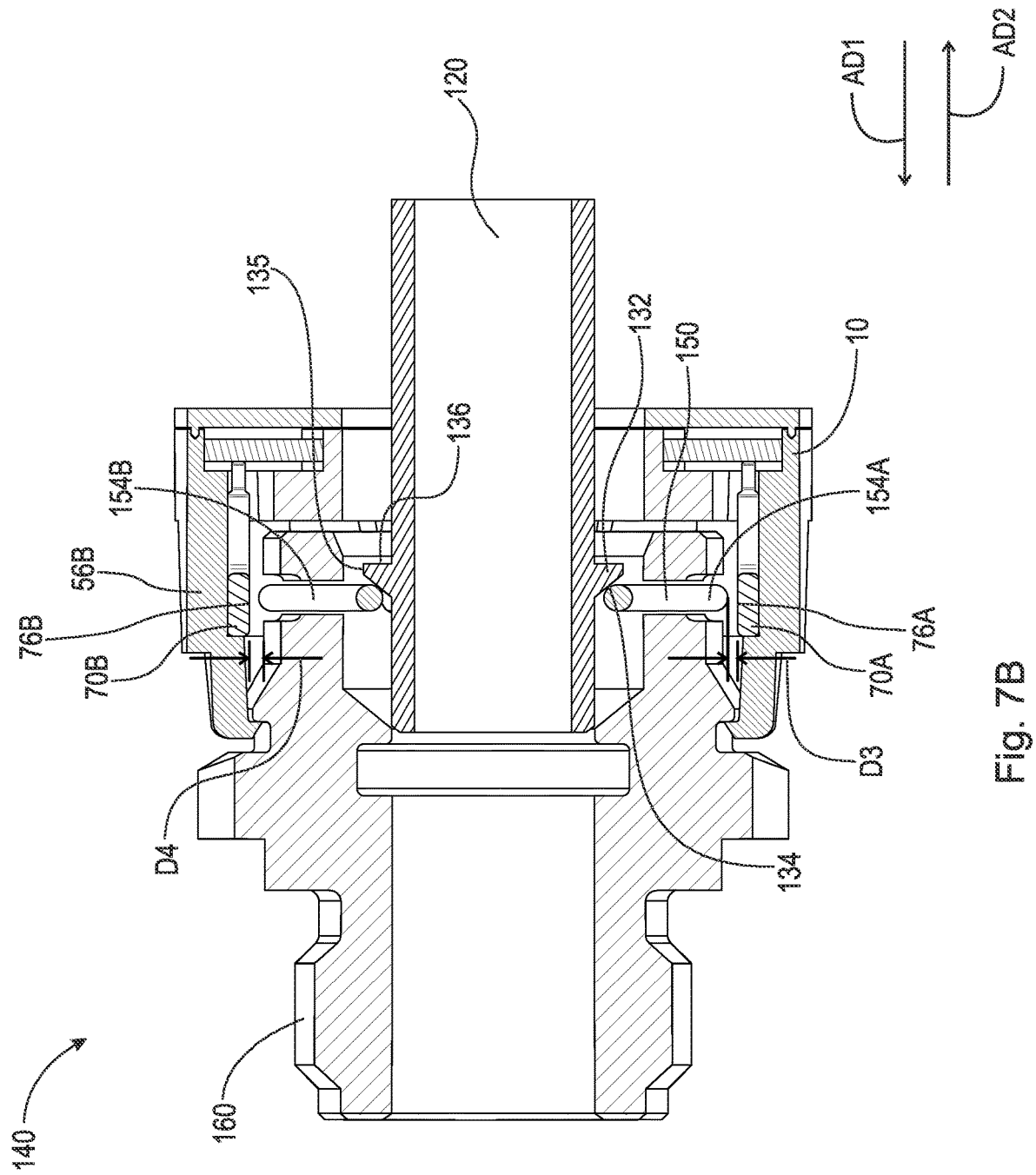
FIG. 7B is a cross-sectional view taken generally along line 7-7 in FIG. 4, with the tube endform partially inserted in the quick connector assembly.

FIG. 7B is a cross-sectional view taken generally along line 7-7 in FIG. 4, with tube endform 120 partially inserted in quick connector assembly 140. As shown, shoulder 132 is partially engaged with retainer clip 150 such that retainer clip is in an expanded state. Specifically, section 154A is spaced apart from plate 70A by distance D3 and section 154A is spaced apart from plate 70A by distance D4. Distance D3 is less than distance D1 and distance D4 is less than distance D2. As tube endform 120 is displaced in axial direction AD1, protrusions 156A-C ride up radially outward facing surface 134.

Figure 7C:
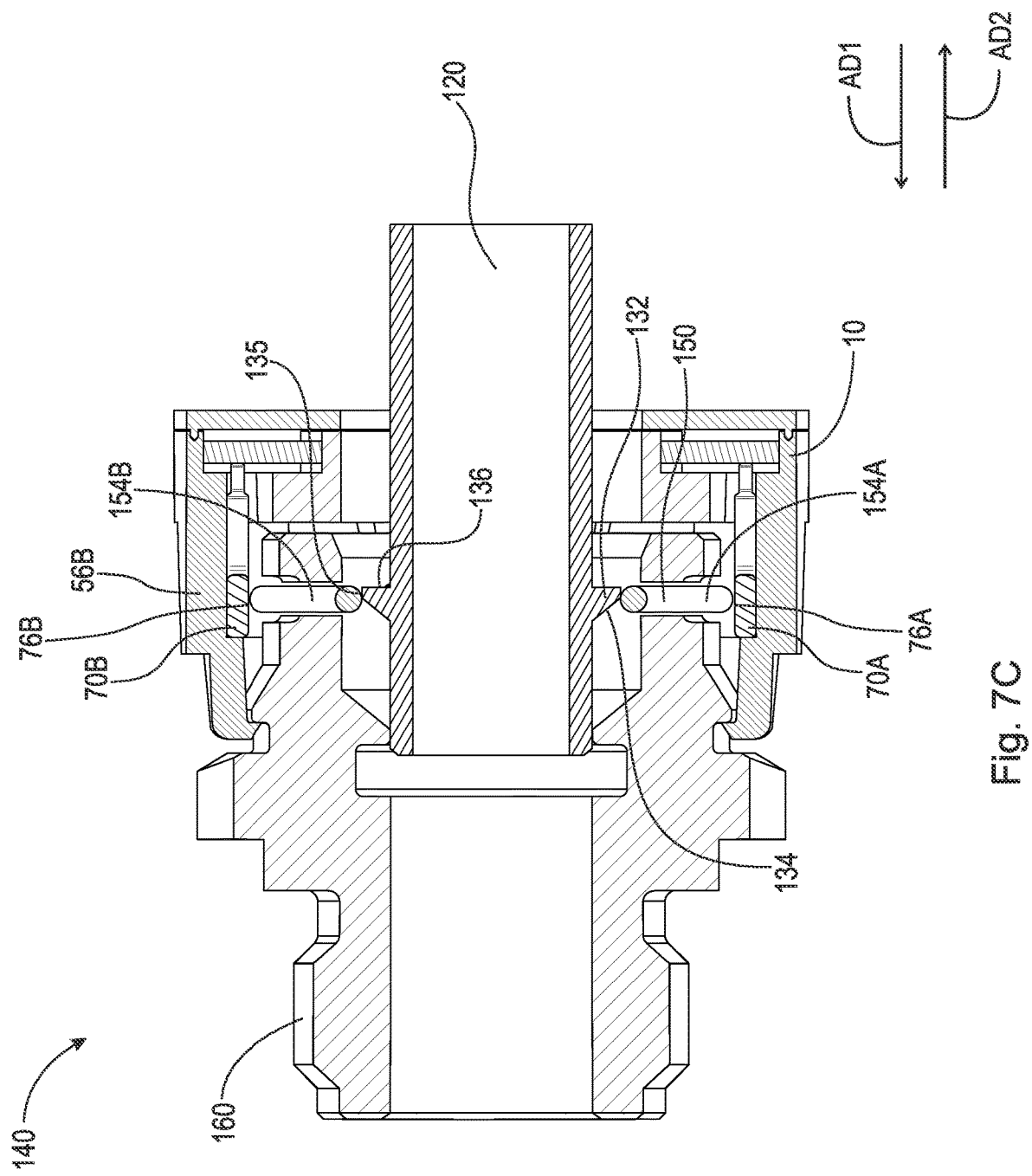
FIG. 7C is a cross-sectional view taken generally along line 7-7 in FIG. 4, with the tube endform partially inserted in the quick connector assembly; and, FIG. 7D is a cross-sectional view taken generally along line 7-7 in FIG. 4, with the tube endform fully inserted in the quick connector assembly.

FIG. 7C is a cross-sectional view taken generally along line 7-7 in FIG. 4, with tube endform 120 partially inserted in quick connector assembly 140. As shown, shoulder 132 is fully engaged with retainer clip 150 such that retainer clip is in an expanded state. Specifically, section 154A is in contact with plate 70A and section 154A is in contact with plate 70A. This occurs when protrusions 156A-C are arranged at the radially outermost portion of radially outward facing surface 134. In some embodiments, tube endform 120 comprises radially outward facing surface 135 and contact between sections 154A-B and plates 70A-B occurs when protrusions 156A-C are arranged on radially outward facing surface 135. When contact between sections 154A-B and plates 70A-B occurs, retainer clip 150 closes the circuit between plates 70A-B and transponder 104 detects the closed circuit and indicates (e.g., by transmission, emission, or RFID tag 106) that quick connector assembly 140 and tube endform 120 are properly connected.

Figure 7D:
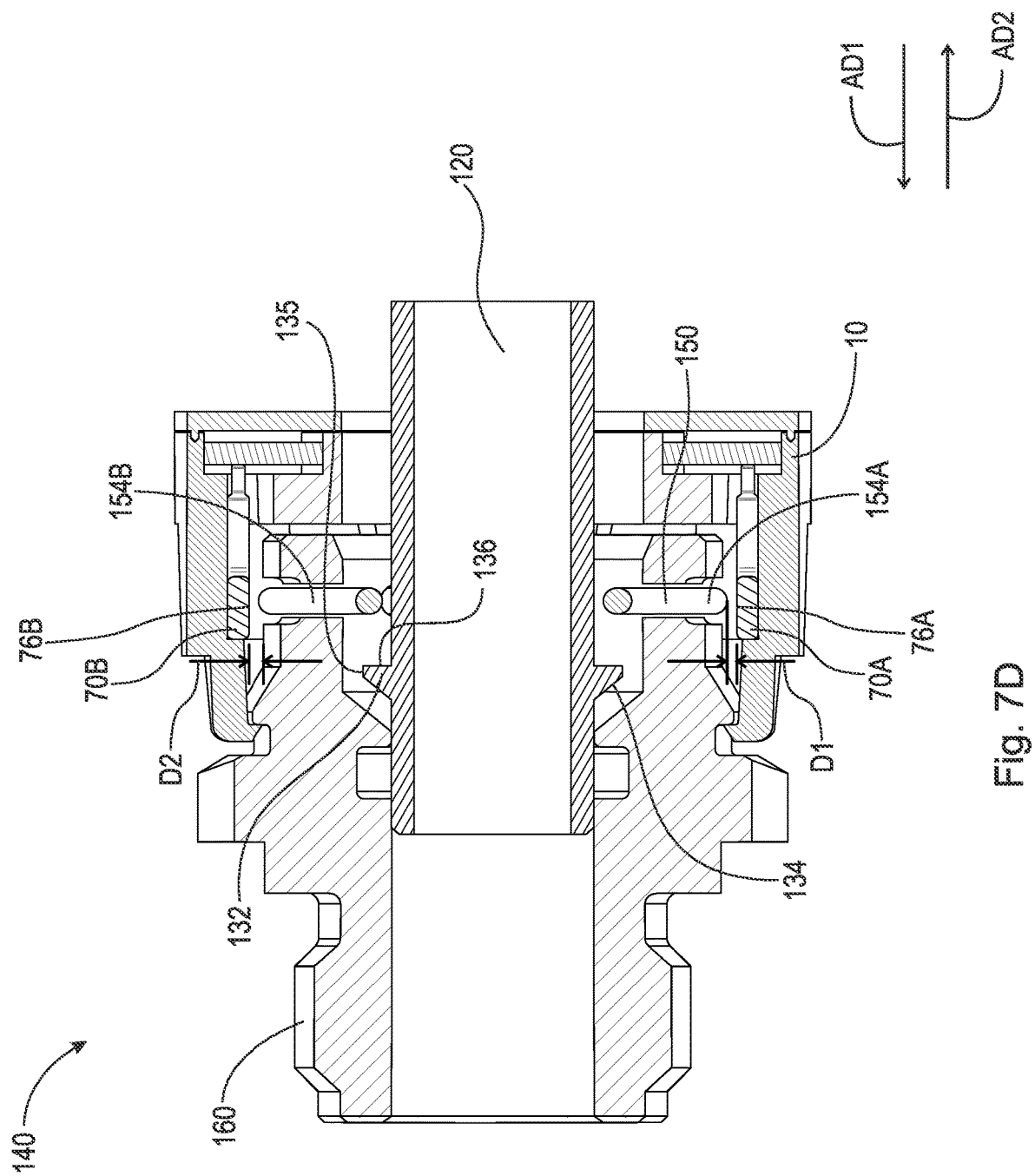

FIG. 7D is a cross-sectional view taken generally along line 7-7 in FIG. 4, with tube endform 120 fully inserted in quick connector assembly 140. Specifically, retainer clip 150 has "snapped back" or displaced radially inward behind shoulder 132 thereby locking tube endform 120 in quick connector assembly 140.

It will be appreciated that various aspects of the disclosure above and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

REFERENCE NUMERALS

10 Connection verifier
20 Cover plate
22 Through-bore
24 Flange
40 Housing
42 Body
44 Through-bore
46 Recess
48 Surface
50A Aperture
50B Aperture
50C Aperture
52 Aperture
54 Surface
56A Arm
56B Arm
56C Arm
58A Tab
58B Tab 58C Tab
60A Radially inward facing surface
60B Radially inward facing surface
60C Radially inward facing surface
62 Protrusion
70A Plate
70B Plate
72A Pin
72B Pin
74A Radially outward facing surface
74B Radially outward facing surface
76A Radially inward facing surface
76B Radially inward facing surface
90 Circuit board
92 Surface
94 Surface
96 Through-bore
98A Terminal
98B Terminal
100 Conductor
102 Power source
104 Transponder
106 Radio-Frequency Identification (RFID) tag
120 Tube endform
122 Through-bore
124 End
126 End
128 Section
130 Radially outward facing surface
132 Shoulder
134 Radially outward facing surface
135 Radially outward facing surface
136 Shoulder surface
138 Section
139 Radially outward facing surface
140 Quick connector assembly
150 Retainer clip
152A End
152B End
154A Section
154B Section
156A Protrusion
156B Protrusion
156C Protrusion
160 Connector
162 End
164 End
166 Through-bore
168 Groove
170A Aperture
170B Aperture
170C Aperture
172 Surface
174 Surface
176 Surface
178 Groove
180 Head
182 Slot
D1 Distance
D2 Distance
D3 Distance
D4 Distance
AD1 Axial direction
AD2 Axial direction

What is claimed is:

1. A connection verifying connector assembly, comprising:
a connector assembly, including:
a first through-bore;
a first annular groove;
a second annular groove; and
a retainer clip arranged in the first annular groove, the retainer clip having one or more protrusions that extend into the first through-bore; and
a connection verifier connected to the connector assembly, including:
a housing including a circuit board;
a first arm and a second arm operatively arranged to connect the housing to the connector assembly;
a first plate connected to the circuit board and arranged radially outward of the retainer clip; and
a second plate connected to the circuit board and arranged radially outward of the retainer clip;
wherein:
the circuit board is arranged to send a voltage through one of the first plate and the second plate; and
the first plate and the second plate are operatively arranged to engage the first arm and the second arm, respectively.

2. The connection verifying connector assembly as recited in claim 1, wherein:
the first arm comprises a first radially inward extending tab; and
the second arm comprises a second radially inward extending tab, the first and second radially inward extending tabs are operatively arranged to engage the second annular groove.

3. The connection verifying connector assembly as recited in claim 1, wherein the housing further comprises a protrusion operatively arranged to engage a slot in the connector assembly to circumferentially align the connection verifier relative to the connector assembly.

4. The connection verifying connector assembly as recited in claim 1, wherein:
the first plate extends through a first aperture in the housing to connect to the circuit board; and
the second plate extends through a second aperture in the housing to connect to the circuit board.

5. The connection verifying connector assembly as recited in claim 1, wherein the circuit board is arranged in a recess in the housing.

6. The connection verifying connector assembly as recited in claim 5, further comprising a cover plate arranged to enclose the circuit board within the recess.

7. The connection verifying connector assembly as recited in claim 1, wherein the circuit board comprises:
a power source;
a conductor that electrically connects the power source to the first and second plates; and
a transponder operatively arranged to detect when a closed circuit between the first and second plates has occurred.

8. The connection verifying connector assembly as recited in claim 7, wherein the circuit board further comprises a radio-frequency identification (RFID) tag operatively arranged to indicate that the closed circuit between the first and second plates has occurred.

9. The connection verifying connector assembly as recited in claim 7, wherein the transponder is operatively arranged to, after detecting that a closed circuit between the first and second plates has occurred, transmit a signal indicating that the closed circuit between the first and second plates has occurred.

10. The connection verifying connector assembly as recited in claim 1, wherein when a tube endform is fully inserted into the connector assembly, the retainer clip expands radially outward to contact the first and second plates, initiating a closed circuit between the first and second plates.

11. A connection verifying connector assembly, comprising:
- a connector assembly, including:
  - a first through-bore;
  - a first annular groove;
  - a second annular groove; and
  - a retainer clip arranged in the first annular groove, the retainer clip having one or more protrusions that extend into the first through-bore; and
- a connection verifier connected to the connector assembly, including:
  - a housing including a circuit board;
  - a first plate connected to the circuit board and arranged radially outward of the retainer clip, the first plate extending through a first aperture in the housing to connect to the circuit board; and
  - a second plate connected to the circuit board and arranged radially outward of the retainer clip, the second plate extending through a second aperture in the housing to connect to the circuit board, wherein the circuit board is arranged to send a voltage through one of the first plate and the second plate.

12. A connection verifying connector assembly, comprising:
- a connector assembly, including:
  - a first through-bore;
  - a first annular groove;
  - a second annular groove; and
  - a retainer clip arranged in the first annular groove, the retainer clip having one or more protrusions that extend into the first through-bore; and
- a connection verifier connected to the connector assembly, including:
  - a housing including a circuit board;
  - a first plate connected to the circuit board and arranged radially outward of the retainer clip; and
  - a second plate connected to the circuit board and arranged radially outward of the retainer clip, wherein:
- the circuit board is arranged to send a voltage through one of the first plate and the second plate; and
- when a tube endform is fully inserted into the connector assembly, the retainer clip expands radially outward to contact the first and second plates, initiating a closed circuit between the first and second plates.

* * * * *